United States Patent

Dernovsek et al.

(10) Patent No.: US 8,569,933 B2
(45) Date of Patent: Oct. 29, 2013

(54) PIEZOELECTRIC MULTILAYER COMPONENT

(75) Inventors: Oliver Dernovsek, Lieboch (AT); Alexander Glazunov, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/303,976

(22) Filed: Nov. 23, 2011

(65) Prior Publication Data

US 2012/0119616 A1    May 17, 2012

Related U.S. Application Data

(63) Continuation of application No. PCT/EP2010/057078, filed on May 21, 2010.

(30) Foreign Application Priority Data

May 29, 2009   (DE) .................. 10 2009 023 349
Sep. 25, 2009   (DE) .................. 10 2009 043 000

(51) Int. Cl.
*H01L 41/083*   (2006.01)

(52) U.S. Cl.
CPC .................... *H01L 41/0838* (2013.01)
USPC ........................................ 310/328

(58) Field of Classification Search
CPC .................................... H01L 41/0838
USPC ............................. 310/328, 365, 366
See application file for complete search history.

(56) References Cited

U.S. PATENT DOCUMENTS

| 7,358,655 B2 | 4/2008 | Ragossnig et al. |
| 7,449,077 B2 | 11/2008 | Heinzmann et al. |
| 7,795,789 B2 | 9/2010 | Schuh |
| 7,982,373 B2 | 7/2011 | Doellgast et al. |
| 8,022,598 B2 | 9/2011 | Kuegerl et al. |
| 2010/0078505 A1* | 4/2010 | Kato ............................. 239/546 |
| 2010/0225204 A1 | 9/2010 | Hamann et al. |
| 2010/0327704 A1* | 12/2010 | Sakamoto et al. ............ 310/365 |

FOREIGN PATENT DOCUMENTS

| DE | 102 34 787 C1 | 10/2003 |
| DE | 103 07 825 A1 | 9/2004 |
| DE | 10 2004 031 404 A1 | 2/2006 |
| DE | 10 2005 015 112 A1 | 10/2006 |
| DE | 10 2007 008 120 A1 | 8/2008 |
| DE | 10 2007 037 500 A1 | 11/2008 |
| EP | 1 850 403 A1 | 10/2007 |
| WO | WO 2009/092585 A1 | 7/2009 |

* cited by examiner

*Primary Examiner* — Derek Rosenau
(74) *Attorney, Agent, or Firm* — Slater & Matsil, L.L.P.

(57) ABSTRACT

A piezoelectric multilayer component includes a stack of sintered piezoelectric layers and inner electrodes that are arranged there between. A piezoelectric layer includes at least one piezoelectric film. At least one of the piezoelectric films is designed as a weakening film, wherein the thickness of the weakening film is substantially smaller than the thickness of at least one of the other piezoelectric films.

20 Claims, 3 Drawing Sheets

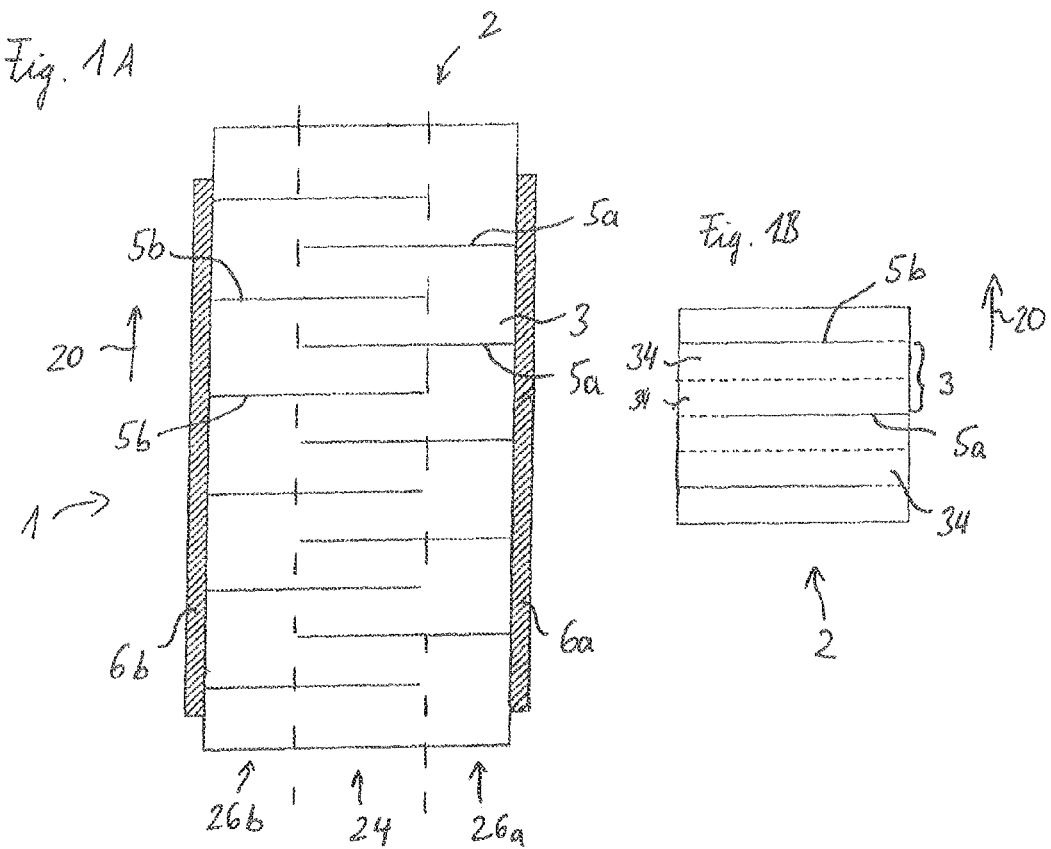
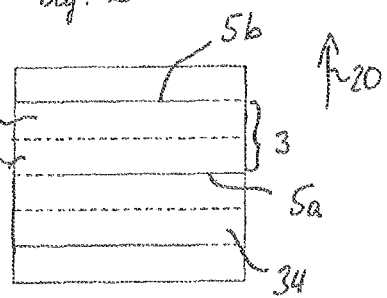
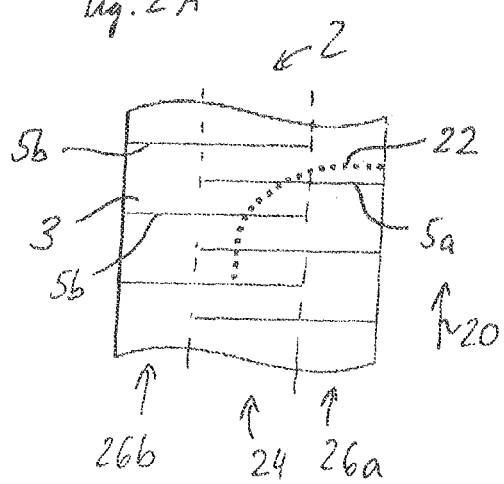
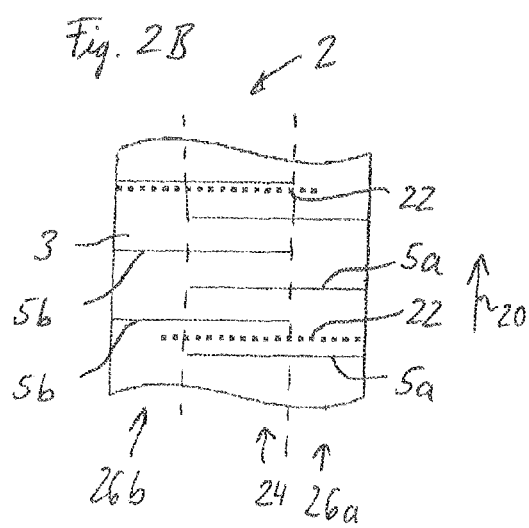

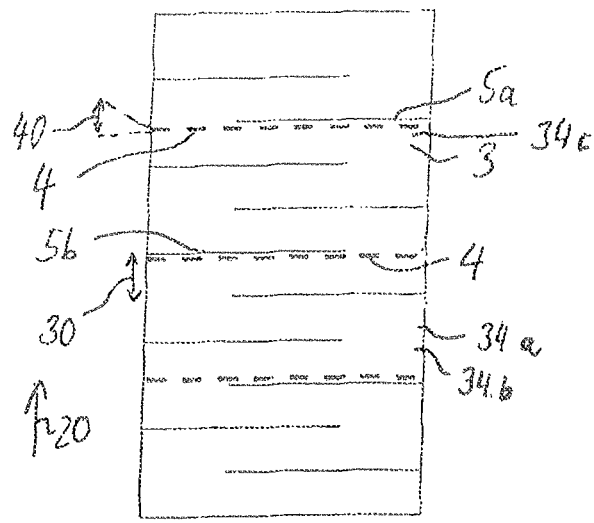
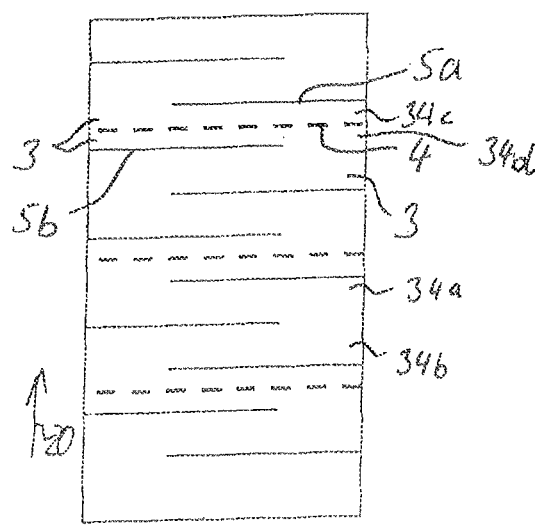

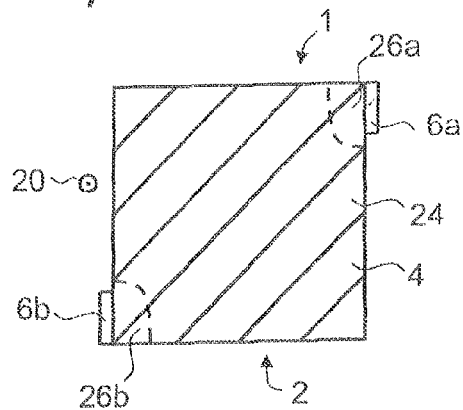
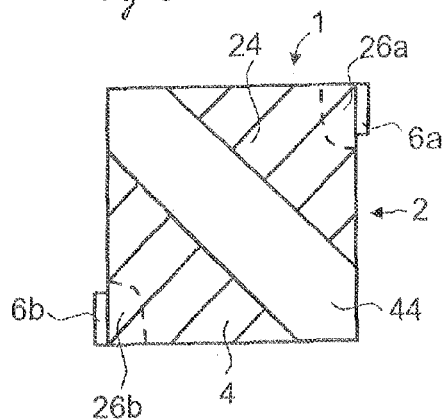
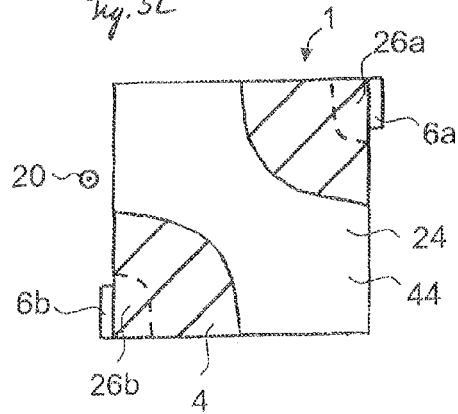
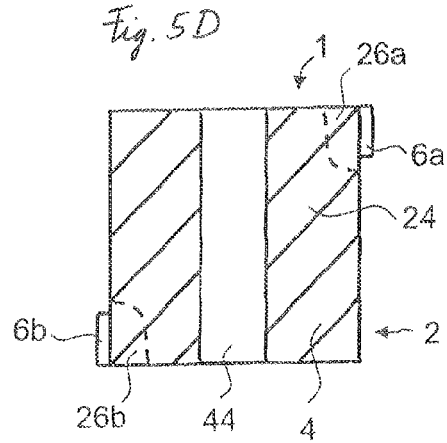

PIEZOELECTRIC MULTILAYER
COMPONENT

This application is a continuation of co-pending International Application No. PCT/EP2010/057078, filed May 21, 2010, which designated the United States and was not published in English, and which claims priority to German Application No. 10 2009 023 349.0, filed May 29, 2009, and German Application No. 10 2009 043 000.8, filed Sep. 25, 2009, each of which is incorporated herein by reference in its entirety.

TECHNICAL FIELD

Embodiments of the present invention relate to a piezoelectric multilayer material.

BACKGROUND

The German publication DE 10307825 A1 describes a multilayer component having a ceramic predetermined breaking layer.

The German publication DE 10234787 C1 describes a multilayer actuator wherein microdisturbances are inserted in the actuator microstructure.

SUMMARY OF THE INVENTION

A piezoelectric multilayer component comprising a stack of sintered piezoelectric layers and internal electrodes arranged therebetween is specified. A multilayer component of this type is a piezoactuator, for example, which can be used for actuating an injection valve in a motor vehicle.

A piezoelectric multilayer component having a stack of sintered piezoelectric layers and internal electrodes arranged therebetween is specified.

Preferably, the multilayer component has a monolithic base body, which is produced for example, from thin films of a piezoelectric material such as lead zirconate titanate (PZT). The internal electrodes can be embodied in the form of electrode layers and can be applied to the films as a metal paste by means of a screen printing method. The films are subsequently stacked, pressed and jointly sintered. Thereby, it is not necessary for an electrode layer to be applied to each film. By way of example, some piezoelectric films between which no electrode layers are situated can be arranged one above another.

"Piezoelectric layer" denotes a section of the stack which comprises a piezoelectric material and is delimited by two adjacent internal electrodes in the stacking direction. A piezoelectric layer is formed from one or a plurality of piezoelectric sheets arranged one above another along the stacking direction. By way of example, a piezoelectric sheet can emerge from a piezoelectric green foil. A piezoelectric layer can also have just a single piezoelectric sheet.

Preferably, external electrodes are applied on two opposite outer areas of the component. An external electrode comprises, for example, a base metallization fired on the stack. The internal electrodes are preferably connected to the external electrodes alternately along the stacking direction of the component. For this purpose, the internal electrodes are led, for example, alternately as far as one of the external electrodes and are at a distance from the second external electrode. In this way, the internal electrodes of one polarity are electrically connected to one another via a common external electrode.

After sintering and the application of external electrodes, the piezoelectric layers are polarized. For this purpose, by way of example, a DC voltage is applied between adjacent internal electrodes and the stack is heated. In so-called inactive zones, in which adjacent internal electrodes of differing polarity do not overlap in the stacking direction, the piezoelectric material does not expand at all or expands to a lesser extent than in the active zones, in which an overlap occurs. As a result of the differing expansion of the piezoelectric layers in inactive and active zones, mechanical stresses arise which can lead to cracks during polarization, during thermal processes or during the operation of the piezoactuator. If the cracks run parallel to the stacking direction, there is the risk of adjacent internal electrodes of differing polarity being connected by the cracks and the short circuit of the component occurring.

At least one of the piezoelectric sheets is embodied as a weakening sheet. The weakening sheet has a lower crack resistance than at least one other piezoelectric sheet.

Preferably, the crack resistance is reduced in such a way that when stresses occur in the component, cracks arise with high probability in the region of the weakening sheet and propagate only along the weakening sheet. In this way, the intention is to prevent the cracks from electrically connecting adjacent internal electrodes of differing polarity and leading to the short circuit.

Preferably, the adhesive strength of the weakening sheet with respect to an adjoining piezoelectric sheet is lower than the adhesive strength of another piezoelectric sheet with respect to a piezoelectric sheet adjoining the latter.

In this case, cracks arise with high probability between the weakening sheet and the adjoining piezoelectric sheet and propagate only within this region.

Furthermore, a piezoactuator of multilayer design is specified, having a stack of sintered piezoelectric layers and electrode layers arranged therebetween. The stack contains at least one piezoelectric weakening sheet having an adhesive strength with respect to adjoining piezoelectric layers which is reduced by comparison with the adhesive strength between further piezoelectric layers. The reduced adhesive strength is produced by a lower reactivity of the piezoelectric layer during the sintering process.

Preferably, the thickness of the weakening sheet is significantly less than the thickness of at least one other piezoelectric sheet.

By way of example, the weakening sheet is only half as thick as another piezoelectric sheet. Preferably, the weakening sheet is thinner than another piezoelectric sheet that is situated in the same piezoelectric layer as the weakening sheet.

By way of example, the thickness of the weakening sheet is in the range of the thickness of an internal electrode. In this case, the weakening sheet is applied to a piezoelectric green foil, for example, in a screen printing method.

In one embodiment, the thickness of the weakening sheet is greater than the thickness of an internal electrode. By way of example, the weakening sheet is at least twice as thick as an internal electrode. Preferably, the weakening sheet is significantly thinner than another piezoelectric sheet and thicker than an internal electrode, for example, at least twice as thick as an internal electrode. By way of example, a weakening sheet that is thicker than an internal electrode can be produced in the form of a green foil.

By virtue of the small thickness of the weakening sheet, the expansion of a crack is limited to a region that is narrowly delimited in the stacking direction. Minimum impairment of the component by a crack is achieved in this way. Moreover, the small expansion of the weakening sheet in the stacking direction also keeps small any possible impairment of the function of the component by the presence of the weakening sheet.

By way of example, the lower adhesive strength of the weakening sheet results from a lower sintering activity of the material of the weakening sheet.

Preferably, some piezoelectric sheets are produced from a first material and the weakening sheet is produced from a second material, wherein the sintering activity of the second material is lower than the sintering activity of the first material. In particular, the second material can have a reduced diffusion rate by comparison with the first material during the sintering process.

In this case, the second material of the weakening sheet grows together with the material of an adjoining sheet less well than the first material of a piezoelectric sheet grows together with the first material of a piezoelectric sheet adjoining the latter. In the sintered multilayer component, this leads to a reduced adhesive strength of the weakening sheet with respect to the adjacent piezoelectric sheet and thus to a predetermined breaking location in the region of the weakening sheet.

There are various possibilities for the arrangement of the weakening sheet in the stack. In one embodiment, the weakening sheet is arranged between a piezoelectric sheet and an internal electrode and adjoins the piezoelectric sheet and the internal electrode.

In a further embodiment, the weakening sheet is arranged within a piezoelectric layer. Preferably, in this case, the weakening sheet is arranged between two piezoelectric sheets of the piezoelectric layer and adjoins these sheets. This arrangement has the advantage that a crack is not produced along an electrode layer.

Preferably, the component has a plurality of weakening sheets. The weakening sheets can be arranged in a manner distributed over the stack. By way of example, a weakening sheet can adjoin each normal, i.e., not reduced in terms of its adhesive strength, piezoelectric sheet. In another embodiment, weakening sheets only adjoin some normal piezoelectric sheets. The weakening sheets are preferably arranged equidistantly.

In one embodiment, the weakening sheet is embodied in a manner structured in a plane perpendicular to the stacking direction of the stack. The weakening sheet preferably has cutouts.

By way of example, the cutouts in the weakening sheet are limited to the active zone of the stack, such that the weakening sheet is embodied in continuous fashion in the inactive zones. In this case, the weakening sheet in the inactive zones is designed for crack formation and crack control that are as optimal as possible. Preferably, the material of the weakening sheet extends at least partly from the inactive zone into the active zone. Preferably, the material of the piezoelectric sheets or internal electrodes adjoining the weakening sheet extends into the cutouts in the active zone, such that, within the cutouts, the surrounding piezoelectric sheets or an adjoining piezoelectric sheet are/is fixedly sintered together with an internal electrode. The cutouts are preferably arranged such that they impede the complete propagation of a crack from one external electrode to the other external electrodes. A short circuit between the external electrodes can be prevented in this way.

In one embodiment, the piezoelectric sheets contain a ceramic material. By way of example, a first ceramic material is used for producing some piezoelectric sheets and a second ceramic material is used for producing the weakening sheet.

Preferably, the first ceramic material differs in its composition from the second ceramic material only slightly or not at all.

By way of example, the second ceramic material contains a ceramic powder having larger grains than the ceramic powder in the first ceramic material. This leads to a reduced diffusion rate of the ceramic particles in the second ceramic material and thus to a reduced adhesive strength of the weakening sheet with respect to an adjoining sheet.

In a further embodiment, the second ceramic material contains a ceramic powder which is calcined at a higher temperature than the ceramic powder in the first ceramic material. The sintering activity of the second material can be reduced in this way.

In a further embodiment, the second ceramic material contains a ceramic powder containing less lead than the ceramic powder of the first ceramic material. By way of example, the second ceramic material contains a smaller proportion of lead oxide. This likewise leads to the reduction of the sintering activity of the second material.

The abovementioned embodiments for the ceramic powder can also be combined. By way of example, the second material can contain a ceramic powder in which both the calcination temperature and the grain size are increased.

Furthermore, a method for producing a piezoelectric multilayer component is specified. In this case, piezoelectric green foils containing a first piezoelectric material are provided. Moreover, a second piezoelectric material is provided, which differs from the first piezoelectric material in its sintering activity. A stack is formed from the piezoelectric green foils and the second piezoelectric material. The stack has at least one sheet containing the second piezoelectric material. The thickness of the sheet containing the second piezoelectric material is in this case chosen such that the sheet in the sintered state is significantly thinner than at least one other sintered piezoelectric sheet produced from a piezoelectric green foil. The stack is subsequently sintered.

The sheet containing the second piezoelectric material can be provided as a dedicated green foil, for example. During the process of forming the stack, this green foil is applied to the green foil containing the first piezoelectric material.

In an alternative embodiment, the second piezoelectric material is applied to one of the green foils containing the first piezoelectric material by means of screen printing.

BRIEF DESCRIPTION OF THE DRAWINGS

The component specified and its advantageous configurations are explained below with reference to schematic figures which are not true to scale and in which:

FIG. 1A shows a longitudinal section of a piezoelectric multilayer component;

FIG. 1B shows an enlarged excerpt from FIG. 1A;

FIG. 2A shows a longitudinal section of part of a piezoelectric multilayer component in which a crack runs perpendicularly to the internal electrodes;

FIG. 2B shows a longitudinal section of part of a piezoelectric multilayer component in which a crack runs parallel to the internal electrodes;

FIG. 3 shows a longitudinal section of part of a first embodiment of a piezoelectric multilayer component with piezoelectric weakening sheets;

FIG. 4 shows a longitudinal section of part of a second embodiment of a piezoelectric multilayer component with piezoelectric weakening sheets;

FIG. 5A shows a plan view of a first embodiment of a piezoelectric weakening sheet in a piezoelectric multilayer component;

FIG. 5B shows a plan view of a second embodiment of a piezoelectric weakening sheet in a piezoelectric multilayer component;

FIG. 5C shows a plan view of a third embodiment of a piezoelectric weakening sheet in a piezoelectric multilayer component; and FIG. 5D shows a plan view of a fourth embodiment of a piezoelectric weakening sheet in a piezoelectric multilayer component.

The following list of reference symbols may be used in conjunction with the drawings:
1 component
2 stack
20 longitudinal direction
22 crack
24 active zone
26a, 26b inactive zone
3 piezoelectric layer
30 thickness
34, 34a, 34b, 34c, 34d piezoelectric sheet
4 weakening sheet
40 thickness
44 cutout
5a, 5b internal electrode
6a, 6b external electrode

DETAILED DESCRIPTION OF ILLUSTRATIVE EMBODIMENTS

FIG. 1 shows a longitudinal section of a piezoelectric multilayer component 1 in the form of a piezoactuator. The component 1 has a stack 2 of piezoelectric layers 3 arranged one above another and internal electrodes 5a, 5b lying therebetween. The internal electrodes 5a, 5b are embodied as electrode layers. The piezoelectric layers 3 and the internal electrodes 5a, 5b are arranged one above another along a stacking direction 20, which corresponds to the longitudinal direction of the stack 2.

The piezoelectric layers 3 contain a ceramic material, for example, lead zirconate titanate (PZT) or a lead-free ceramic. The ceramic material can also contain dopants. The internal electrodes 5a, 5b contain silver-palladium or copper, for example. In particular, the internal electrodes 5a, 5b can contain materials from the set of pure copper, a mixture or alloy of copper and palladium, pure silver, a mixture or alloy of silver and palladium, pure platinum or a mixture of platinum and silver, or can consist of one of these materials. In order to produce the stack 2, by way of example, green foils containing a ceramic powder, an organic binder and a solvent are produced by foil drawing or foil casting. An electrode paste is applied to some of the green foils by means of screen printing in order to form the internal electrodes 5a, 5b. The green foils are stacked one above another along a longitudinal direction 20 and pressed. The preliminary products of the components in the desired form are separated from the foil stack. Finally, the stack of piezoelectric green foils and electrode layers is sintered.

FIG. 1B shows an excerpt from the stack 2 composed of piezoelectric layers 3 and internal electrodes 5a, 5b in accordance with FIG. 1A.

In this case, a piezoelectric layer 3 denotes the region of the stack which contains a piezoelectric material and is bounded by two adjacent internal electrodes 5a, 5b in the longitudinal direction. A piezoelectric layer 3 can have a plurality of piezoelectric sheets 34. By way of example, a piezoelectric sheet 34 is produced from a green foil.

In the exemplary embodiment shown here, a piezoelectric layer 3 has in each case two piezoelectric sheets 34. In further embodiments, a piezoelectric layer 3 can also have only one piezoelectric sheet 34 or more than two piezoelectric sheets 34. Within a stack 2, the piezoelectric layers 3 can also differ in terms of the number of piezoelectric sheets 34.

As can be seen in FIG. 1A, the component 1 has two external electrodes 6a, 6b, which are arranged at the outer side of the stack 2. In the embodiment shown here, the external electrodes 6a, 6b are arranged on opposite side areas of the component 1 and run in strip form along the stacking direction 20. The external electrodes 6a, 6b contain silver-palladium or copper, for example, and can be applied to the stack 2 as a metal paste and fired.

The internal electrodes 5a, 5b are alternately led as far as one of the external electrodes 6a, 6b and spaced apart from the second external electrode 6b, 6a, along the stacking direction 20. In this way, the external electrodes 6a, 6b are alternately electrically connected to the internal electrodes 5a, 5b along the stacking direction 20. In order to produce the electrical connection, a connection element (not shown here) can be applied to the external electrodes 6a, 6b, e.g., by soldering.

The component 1 expands in the longitudinal direction 20 when a voltage is applied between the external electrodes 6a, 6b. In a so-called active zone 24, in which adjacent internal electrodes 5a, 5b in the stacking direction 20 overlap, an electric field arises when a voltage is applied to the external electrodes 6a, 6b, such that the piezoelectric layers 3 expand in the longitudinal direction 20. In inactive zones 26a, 26b, in which adjacent electrode layers 5a, 5b do not overlap, the piezoactuator expands only slightly.

On account of the different expansion of the component 1 in the active zone 24 and inactive zones 26a, 26b, mechanical stresses occur in the stack 2. Such stresses can lead to cracks in the stack 2.

FIG. 2A shows an excerpt from a stack 2 composed of piezoelectric layers 3 and internal electrodes 5a, 5b, wherein a crack 22 has arisen in the stack 2. The crack 22 runs within the inactive zone 26a parallel to the internal electrodes 5a, 5b, and bends away at the transition into the active zone 24 and runs in the active zone 24 through adjacent internal electrodes 5a, 5b of differing polarity. This can lead to a short circuit of the internal electrodes 5a, 5b.

FIG. 2B shows an excerpt from a stack 2 composed of piezoelectric layers 3 and internal electrodes 5a, 5b, in which a crack 22 has likewise arisen. Here, the crack 22 runs both in the inactive zones 26a, 26b and in the active zone 24 parallel to the internal electrodes 5a, 5b. In the case of such a course of cracks 22, the risk of short circuits is reduced.

In order to promote such a course of cracks 22, piezoelectric weakening sheets having a reduced adhesive strength with respect to adjoining piezoelectric sheets are introduced into the stack 2. As a result of the reduced adhesive strength, cracks 22 arise particularly readily at an interface between the weakening sheet and an adjoining piezoelectric sheet and propagate particularly readily along the interface.

FIG. 3 shows a longitudinal section of a stack 2 composed of piezoelectric layers 3 and internal electrodes 5a, 5b, wherein piezoelectric weakening sheets 4 are arranged at a plurality of locations of the stack 2. The stack 2 is part of a piezoactuator, for example.

The piezoelectric weakening sheets 4 have a reduced adhesive strength with respect to an adjoining piezoelectric sheet 34c of a piezoelectric layer 3. In particular, the adhesive strength of a weakening sheet 4 is lower than the adhesive strength of another piezoelectric sheet 34a with respect to a piezoelectric sheet 34b adjoining the latter. The piezoelectric weakening sheets 4 are arranged here in each case between a piezoelectric sheet 34c and internal electrodes 5a, 5b and adjoin the internal electrodes 5a, 5b and the piezoelectric sheet 34c. The piezoelectric weakening sheets 4 can be arranged above or below the adjoining internal electrode 5a, 5b as viewed along the longitudinal direction 20.

The thicknesses 40 of the piezoelectric weakening sheets 4 are significantly smaller than the thicknesses 30 of the other piezoelectric sheets 34a, 34b, 34c. By way of example, the piezoelectric weakening sheets 4 are between 1 and 10 µm thick. Weakening sheets having such thicknesses can be produced by means of screen printing, for example. In further embodiments, the thickness of a piezoelectric weakening sheet is between 1 and 100 µm. Weakening sheets in the range of 10 to 100 µm can be produced by foil drawing, for example.

What is intended to be achieved by the formation of weakening sheets 4 is that a crack runs as much as possible in a plane parallel to the stacking direction 20. Moreover, what is intended to be achieved by the small thickness 40 is that the function of the piezoelectric component 1 is impaired as little as possible.

In order to produce such a stack 2 comprising weakening sheets 4, green foils containing a first piezoelectric material, for example, are provided. An electrode paste is applied to some of the green foils by means of screen printing. A second piezoelectric material is applied thereto by means of screen printing, the second piezoelectric material having a reduced sintering activity relative to the first piezoelectric material. The second piezoelectric material can also be applied to a green foil before the electrode paste is applied. Afterward, the green foils are stacked one above another, and pressed, and the green preliminary product of the component is separated therefrom.

As an alternative thereto, the piezoelectric weakening sheet 4 can be produced from a piezoelectric green foil containing the second piezoelectric material, which is then arranged with the other green foils to form a stack and pressed.

The stack is finally sintered to form a monolithic sintering body, for example, at a sintering temperature in the range of between 800 and 1500° C. During the sintering operation, diffusion processes of particles in the piezoelectric sheets and in the internal electrodes lead to a strong binding between the piezoelectric sheets and the internal electrodes. In particular, the metal particles from the electrode layers form a fixed contact with grains from a ceramic layer.

Likewise, a fixed mechanical composite arises between individual sheets of a piezoelectric layer during sintering as a result of diffusion processes of particles in the piezoelectric sheets. The ceramic particles of the different sheets grow together and form a fixed binding at the interface of two sheets.

The second piezoelectric material has a significantly lower diffusion rate than the first piezoelectric material during the sintering operation. The reduced diffusion rate has the effect that the ceramic particles from the second piezoelectric material and the first piezoelectric material grow together only weakly. Considered microscopically, the contact between these particles is preferably reduced only to the formation of necks. In particular, the diffusion rate of the second piezoelectric material at high temperatures, i.e., the temperatures in the range of 800 to 1500° C. that are present during the sintering operation, is significantly lower than the diffusion rate of the first piezoelectric material.

Preferably, the composition of the second piezoelectric material differs only slightly or does not differ from the composition of the first piezoelectric material.

By way of example, the proportion of ceramic powder in the first piezoelectric material in the green state is between 30 and 70 vol %, preferably between 45 and 60 vol %. The remaining proportions by volume are taken up for example by binder and pores.

Preferably, the proportion by volume of organic binder in the second piezoelectric material is as close as possible to the proportion by volume in the first piezoelectric material. The occurrence of problems during the binder removal process can be avoided in this way.

In one embodiment, the sintering activity of the second piezoelectric material can be reduced by the use of a ceramic powder comprising larger grains than in the first piezoelectric material.

By way of example, the second piezoelectric material contains a ceramic powder wherein the median value $d_{50}$ of the distribution of the grain sizes is at least 0.3 µm, preferably at least 0.6 µm, above the median value of the distribution of the grain sizes of the ceramic powder in the first piezoelectric material. By way of example, the median value $d_{50}$ of the grain sizes of the ceramic powder for the further piezoelectric layers is between 0.3 and 1.0 µm, preferably between 0.4 and 0.7 µm. Preferably, the composition of the ceramic material in the weakening sheet is identical to the composition in the other piezoelectric sheets.

In a further embodiment, the second piezoelectric material contains a ceramic powder which is calcined at a higher temperature than ceramic powder in the first piezoelectric material. The difference in the calcination temperature is preferably at least 20° C., particularly preferably at least 50° C. Preferably, the composition of the ceramic material in the weakening sheet is identical to the composition in the other piezoelectric sheets.

In a further embodiment, the second piezoelectric material contains a ceramic powder containing less lead, e.g., in the form of lead oxide, than the ceramic powder of the first piezoelectric material. Preferably, in this case, the ceramic powder contains lead zirconate titanate (PZT). Preferably, the difference is at least 0.5 mol % lead, particularly preferably at least 1.5 mol % lead.

As is shown in FIG. 3, a plurality of weakening sheets 4 are arranged in the stack 2. In further embodiments of a component 1, only a single weakening sheet 4 is situated in the stack 2. In a further embodiment, a weakening sheet 4 can also adjoin each internal electrode 5a, 5b.

FIG. 4 shows a further embodiment of a stack 2 wherein piezoelectric weakening sheets 4 are arranged within the piezoelectric layers 3. The piezoelectric weakening sheets 4 adjoin two sheets 34c, 34d of a piezoelectric layer 3. The production of such a stack 2 proceeds analogously to the production of the stack 2 in accordance with FIG. 3, here the second piezoelectric material not being applied in a manner adjoining an electrode layer.

In the exemplary embodiment shown here, a plurality of piezoelectric weakening sheets 4 are arranged in a manner distributed in the stack 2. In further exemplary embodiments, only a single piezoelectric weakening sheets 4 can be situated in the stack 2. As an alternative thereto, piezoelectric weakening sheets 4 can also be arranged between all sheets 34 of a piezoelectric layer 3.

In further embodiments, the arrangements of the piezoelectric weakening sheets 4 in accordance with FIG. 3 and FIG. 4 can also be combined, such that in a stack 2 some piezoelectric weakening sheets 4 adjoin internal electrodes 5a, 5b and further piezoelectric weakening sheets 4 are arranged within piezoelectric layers 3.

FIGS. 5A to 5D show various embodiments of structured piezoelectric weakening sheets 4. A cross section of a component 1 with a plan view of a piezoelectric weakening sheet 4 can be seen in each case.

The external electrodes 6a, 6b are arranged on opposite side areas of the stack 2 and run as narrow strips along the longitudinal direction 20 in the region of diagonally opposite longitudinal edges. The electrode layers (not visible here) are alternately led as far as one of the external electrodes 6a, 6b and spaced apart from the further external electrode 6b, 6a. The inactive zones 26a, 26b run within a narrowly delimited region in the region of the diagonally opposite longitudinal edges.

FIG. 5A shows an embodiment in which the piezoelectric weakening sheet 4 covers the entire cross section of the stack 2.

FIG. 5B shows an embodiment in which the piezoelectric weakening sheet 4 has a cutout 44 running along a diagonal of the stack 2.

In the cutout 44, the first piezoelectric material of the underlying piezoelectric layer or material of internal electrodes 5a, 5b can be seen. Preferably, the piezoelectric weakening sheet 4 is applied to another piezoelectric sheet by means of screen printing.

The material of the piezoelectric weakening sheet 4 is applied in the region of the inactive zones 26a, 26b. In this way, in the region in which mechanical stresses and hence also cracks occur to an intensified extent, the weakening sheet is optimized with regard to its crack formation and crack guiding capability. By contrast, an increased adhesive strength is present within the cutout lying in the active zone 24. Consequently, cracks run with a reduced probability in the region of the cutout 44 or through the cutout 44. The cutout 44 is arranged in such a way that a crack runs with low probability in the plane of the piezoelectric weakening sheet 4 from an external electrode 6a to the diagonally opposite external electrode 6b. The risk of a short circuit between the external electrodes 6a, 6b is reduced in this way.

FIG. 5C shows a further embodiment of a piezoelectric weakening sheet 4, wherein a cutout 44 is present. In this case, too, the cutout 44 is arranged in the active zone 24 and is arranged between the inactive zones 26a, 26b in such a way that a crack electrically conductively connects the external electrodes 6a, 6b to one another with low probability. The cutout 44 has rounded outer lines. The probability of a crack bending away into the cutout 44 can be reduced in this way.

FIG. 5D shows a further embodiment, wherein the piezoelectric weakening sheet 4 has a cutout 44 which runs parallel to the opposite outer sides of the component 1 on which the external electrodes 6a, 6b are arranged, and which connects two further outer sides of the stack.

The possible embodiments of piezoelectric weakening sheets are not restricted to the geometries shown here. In particular, the cutout is not only able to run parallel to the side areas or along a diagonal of the stack, but can also have any other orientation.

The invention is not restricted to the exemplary embodiments by the description on the basis of the exemplary embodiments, but rather encompasses any novel feature and also any combination of features. This includes in particular any combination of features in the patent claims, even if this feature or this combination itself is not explicitly specified in the patent claims or exemplary embodiments.

What is claimed is:

1. A piezoelectric multilayer component, comprising:
a stack of sintered piezoelectric layers; and
internal electrodes arranged between the piezoelectric layers;
wherein each piezoelectric layer comprises at least one piezoelectric sheet,
wherein at least one of the piezoelectric sheets is embodied as a weakening sheet having a lower crack resistance than at least one other piezoelectric sheet,
wherein a thickness of the weakening sheet is significantly less than a thickness of the at least one other piezoelectric sheet,
wherein the piezoelectric sheets contain a ceramic material, and
wherein the ceramic material of the weakening sheet differs from the ceramic material of the at least one other piezoelectric sheet in grain size.

2. The multilayer component according to claim 1, wherein the weakening sheet has an adhesive strength with respect to an adjoining piezoelectric sheet that is lower than an adhesive strength of another piezoelectric sheet with respect to a piezoelectric sheet adjoining the another piezoelectric sheet.

3. The multilayer component according to claim 2, wherein the lower adhesive strength of the weakening sheet results from a lower sintering activity of a material of the weakening sheet.

4. The multilayer component according to claim 1, wherein the thickness of the weakening sheet is in the range of 1 to 10 μm.

5. The multilayer component according to claim 1, wherein the weakening sheet is arranged between an adjoining piezoelectric sheet and an adjoining internal electrode and adjoins both the adjoining piezoelectric sheet and the adjoining internal electrode.

6. The multilayer component according to claim 1, wherein the weakening sheet is arranged within one of the piezoelectric layers.

7. The multilayer component according to claim 1, wherein a plurality of weakening sheets are arranged in a manner distributed over the stack.

8. The multilayer component according to claim 1, wherein the weakening sheet is structured in a plane perpendicular to a stacking direction of the stack.

9. The multilayer component according to claim 8, wherein the weakening sheet has cutouts.

10. The multilayer component according to claim 1, wherein the ceramic material of the weakening sheet comprises a ceramic powder having larger grains than a ceramic powder in the ceramic material of the at least one other piezoelectric sheet.

11. The multilayer component according to claim 1, wherein the ceramic material of the weakening sheet comprises a ceramic powder that is calcined at a higher temperature than a ceramic powder in the ceramic material of the at least one other piezoelectric sheet.

12. The multilayer component according to claim 1, wherein the ceramic material of the weakening sheet comprises a ceramic powder comprising less lead than a ceramic powder in the ceramic material of the at least one other piezoelectric sheet.

13. The multilayer component according to claim 1, wherein the ceramic material of the weakening sheet differs from the ceramic material of the at least one other piezoelectric sheet in calcination temperature.

14. A piezoelectric multilayer component, comprising:
a stack of sintered piezoelectric layers; and
internal electrodes arranged between the piezoelectric layers;
wherein each piezoelectric layer comprises at least one piezoelectric sheet,
wherein at least one of the piezoelectric sheets is embodied as a weakening sheet having a lower crack resistance than at least one other piezoelectric sheet,
wherein a thickness of the weakening sheet is significantly less than a thickness of the at least one other piezoelectric sheet,
wherein the piezoelectric sheets contain a ceramic material,
wherein the ceramic material of the weakening sheet differs from the ceramic material of the at least one other piezoelectric sheet in a content of lead oxide, and wherein a mole percentage of lead in the ceramic material of the weakening sheet is less than a mole percentage of lead in the ceramic material of the at least one other piezoelectric sheet.

15. The multilayer component according to claim 14, wherein the difference in the content of lead oxide comprises at least 1.5 mole percentage lead.

16. The multilayer component according to claim 14, wherein the weakening sheet has an adhesive strength with respect to an adjoining piezoelectric sheet that is lower than an adhesive strength of another piezoelectric sheet with respect to a piezoelectric sheet adjoining the another piezoelectric sheet.

17. The multilayer component according to claim 14, wherein the lead oxide of the ceramic material of the weakening sheet consists essentially of the elements lead and oxygen.

18. The multilayer component according to claim 14, wherein the thickness of the weakening sheet is in the range of 1 to 10 μm.

19. The multilayer component according to claim 14, wherein the weakening sheet is arranged between an adjoining piezoelectric sheet and an adjoining internal electrode and adjoins both the adjoining piezoelectric sheet and the adjoining internal electrode.

20. The multilayer component according to claim 14, wherein the weakening sheet is arranged within one of the piezoelectric layers.

* * * * *